(12) United States Patent
Kull

(10) Patent No.: US 8,633,847 B2
(45) Date of Patent: Jan. 21, 2014

(54) ANALOG-DIGITAL CONVERTER

(75) Inventor: Lukas Kull, Zurich (CH)

(73) Assignee: International Business Machines Corporation, Amonk, NY (US)

(*) Notice: Subject to any disclaimer, the term of this patent is extended or adjusted under 35 U.S.C. 154(b) by 0 days.

(21) Appl. No.: 13/523,331

(22) Filed: Jun. 14, 2012

(65) Prior Publication Data

US 2013/0002463 A1 Jan. 3, 2013

(30) Foreign Application Priority Data

Jun. 28, 2011 (EP) ...................................... 11171761

(51) Int. Cl.
*H03M 1/12* (2006.01)

(52) U.S. Cl.
USPC ............ 341/172; 341/118; 341/120; 341/155

(58) Field of Classification Search
USPC .................................. 341/118, 120, 155, 172
See application file for complete search history.

(56) References Cited

U.S. PATENT DOCUMENTS 7,233,273 B2 * 6/2007 Tachibana et al. ............ 341/155
7,773,024 B2 * 8/2010 Ohnhauser et al. ........... 341/172

* cited by examiner

*Primary Examiner* — Jean B Jeanglaude
(74) *Attorney, Agent, or Firm* — Eustus Dwayne Nelson; Ryan, Mason & Lewis, LLP

(57) ABSTRACT

A differential analog-digital converter is provided. The converter comprises a decision unit for evaluating a potential difference between two input signal lines, a number of charging units for each input signal line each configured to add a predetermined charge onto the respective input signal line, a number of discharging units for each input signal line each configured to remove a predetermined charge from the respective input signal line and a control unit for selectively switching each of the charging units and discharging units so that depending on one result of evaluating the potential difference between the two input signal lines one of the input signal lines is charged by adding the predetermined charge of the respective switched charging unit while the respective other of the input signal lines is discharged by removing the predetermined charge of the respective switched discharging unit.

12 Claims, 4 Drawing Sheets

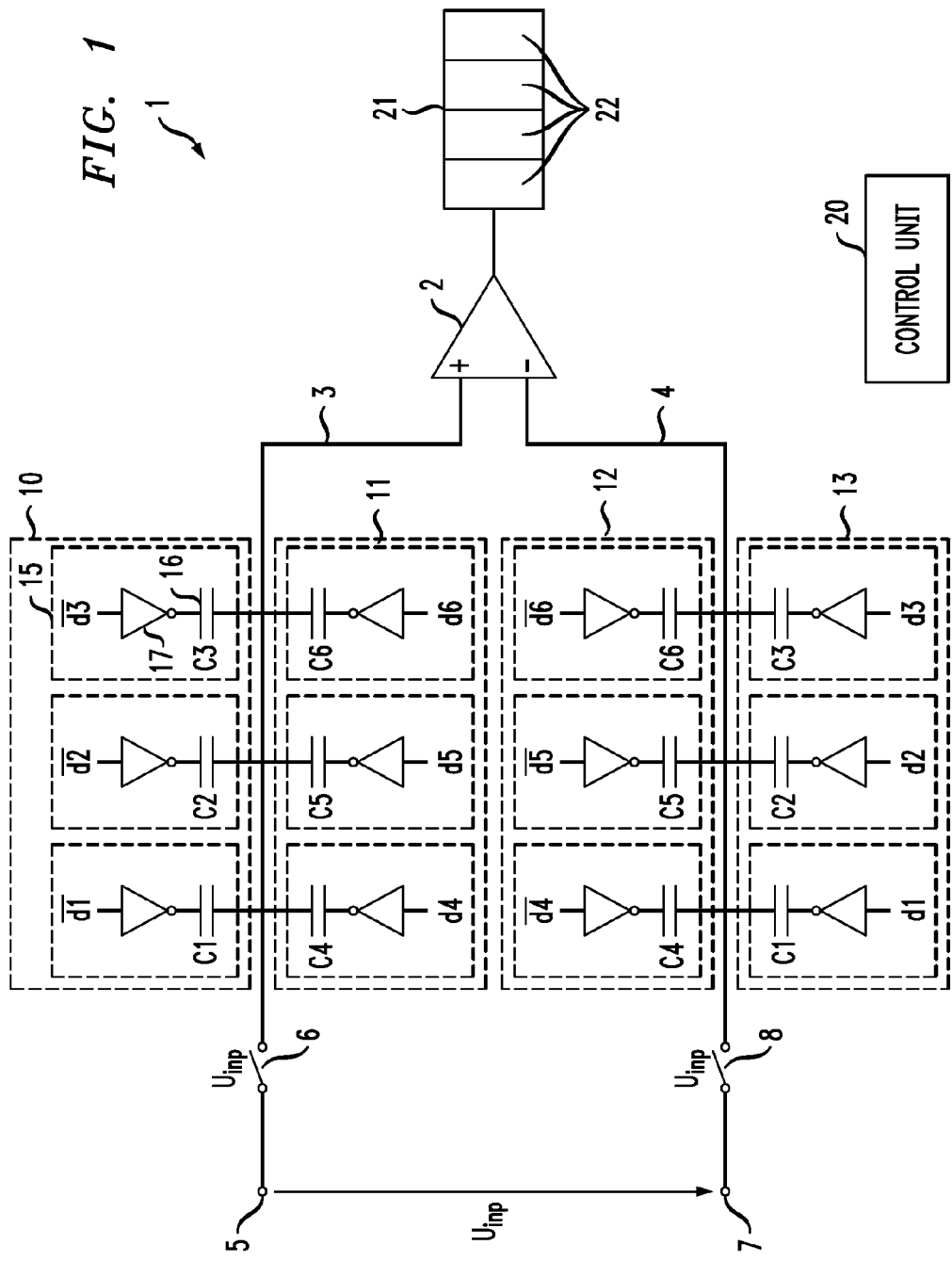

ANALOG-DIGITAL CONVERTER

PRIORITY CLAIM

The present application claims priority to the European Patent application identified as 11171761.7, filed on Jun. 28, 2011, and entitled "Analog-digital Converter," the disclosure of which is incorporated by reference herein in its entirety.

FIELD

The present application relates to analog-digital converters, in particular to successive approximation register (SAR) converters. In particular, the present application relates to an SAR converter topology for converting differential input signals.

BACKGROUND

SAR converters for analog-digital conversion are well known in the art. In particular, SAR converters are frequently used in integrated CMOS devices since they provide a wide range of achievable resolution and conversion time and have competitive power efficiency. Furthermore, SAR converters can be implemented by optimally utilizing the advantages of the CMOS technology, which are small-sized switches and capacitors having well-defined relative capacitances.

SAR converters can be designed for non-differential or differential input signals.

According to one well-known topology, differential SAR converters include at least one capacitor bank on each input signal line. Each capacitor bank has capacitors of different values, usually with a relation between the capacitances by a factor of (n=integer). Each capacitor is connected between the signal line and a first reference potential and is further associated with a switch, so that the respective capacitor can be disconnected from the first reference potential and connected to a second reference potential. In the sampling phase, a voltage level of an input signal applied to the signal lines is stored on each capacitor of the capacitor bank. In a succeeding conversion phase, the second reference potential is applied successively, i.e. from the highest capacitance to the lowest capacitance, on the capacitors while it is determined whether the resulting voltage on the input signal lines is positive or negative. The determination results are stored as result bits in a register. The capacitor bank of the capacitor on which the second reference potential is applied is selected depending on the result bit of the determination just carried out before.

According to another known topology, the capacitor banks of an differential SAR analog-digital converters may have a C-2C design wherein the capacitor ladder is formed by switched capacitances C which are coupled via a capacity with a capacitance of 2C.

The differential SAR analog-digital converter as described above has a capacitor bank on each of the input signal lines, a decision latch to receive the input signal line voltage and a logic block which adjusts the switching of the capacitor levels depending on a previous determination in the decision latch. Usually, the capacitors of the capacitor banks are all set to a negative reference potential for sampling the input signal and are partially switched to a positive reference potential in the process of conversion. When a capacitor is switched so that a positive reference potential is applied, a capacitor charge depending on the switched reference potential difference and the capacitance of the capacitor is loaded onto the respective input signal line, thereby increasing its potential. Since in the conversion phase capacitors of both capacitor banks on the input signal lines are switched the potentials of the input signal lines tend to be increased. The result is an increase of the input common mode voltage on the input signal lines applied on the decision latch. Since the input common mode voltage variation negatively affects the latch noise and the latch conversion speed, it is generally desirable to keep the input common mode as constant as possible.

SUMMARY

In one embodiment, a differential analog-digital converter is provided. The converter comprises a decision unit for evaluating a potential difference between two input signal lines, a number of charging units for each input signal line each configured to add a predetermined charge onto the respective input signal line, a number of discharging units for each input signal line each configured to remove a predetermined charge from the respective input signal line and a control unit for selectively switching each of the charging units and discharging units so that depending on one result of evaluating the potential difference between the two input signal lines one of the input signal lines is charged by adding the predetermined charge of the respective switched charging unit while the respective other of the input signal lines is discharged by removing the predetermined charge of the respective switched discharging unit.

The analog-digital converter provides charging and discharging units on each input signal line. When after a decision step the voltage difference between one input signal line and the other input signal line needs to be changed, this is done both by increasing the electrical charge on one input signal line and by decreasing the electrical charge on the other input signal line.

For example, after each decision step, two capacitors of two capacitor banks on different input signal lines are switched, so that either the potential of the one input signal line is increased and the potential of the second input signal line is decreased, or that the potential of the first input signal line is decreased and the potential of the second input signal line is increased.

Applying such a switching scheme may reduce or fully avoid variations of the input common mode voltage at the inputs of the decision latch. The input common mode voltage of the decision latch affects decision accuracy and comparison speed. In conventional designs, the input common mode voltage variations have been traded for power by increasing the dimensions. By keeping the input common mode voltage variations low, the sizes of the electronic components of the decision latch can be decreased and so chip area can be saved. Furthermore, smaller electronic components allow for lower power consumption. Keeping the input common mode voltage variations low also allows for an optimal common mode of the latch in terms of conversion speed.

Further the number of charging units and/or the number of discharging units may comprise switched capacitor units each having a capacitor and a semiconductor switch.

In particular, in at least one of the charging units and discharging units the respective capacitor is coupled with a first end at the respective input signal line and with a second end to the output of the semiconductor switch.

It may be provided that in one setting step the predetermined charge to add to the one input signal line may equal the predetermined charge to remove from the other input signal line.

To keep the input common mode voltage variation as constant as possible, the mean value of the potential on the input signal lines is to be kept constant for each capacitor switching. In other words, the charges to be added to the one input line equal the amount of charges which is removed from the other input signal line depending on the voltage difference to be increased. Presuming a total overall capacitance of the input signal lines with respect to a common ground potential to be equal, this leads to no variation of the input common mode voltage at the input of the decision latch. This scheme can be applied analogously in case the voltage difference between the input signal lines shall be decreased.

It can be provided that the control unit is configured to perform a number of decision steps by means of the decision unit wherein in one decision step the predetermined charge to add to the one input signal line and the predetermined charge to remove from the other input signal line are adapted so that an absolute value of the potential change on the two input signal lines is equal. In case the total overall capacitance of the input signal lines with respect to a common ground potential is not equal, it is necessary, to keep the input common mode voltage variation as constant as possible, that the charges to be applied to the input signal lines results in the same potential change but with different signs.

Moreover, the control unit may be configured to perform a number of decision steps by means of the decision unit wherein the predetermined charges to be added to the one input signal line and to be removed from the other input signal line within one decision step are decreasing from one decision step to the next.

The control unit may be configured to perform a number of decision steps by means of the decision unit wherein the predetermined charges to be added to the one input signal line and to be removed from the other input signal line within one decision step are decreasing from one decision step to the next by a factor of 2.

In another embodiment, a method for performing an analog digital conversion is provided. The method comprises the steps of performing a number of decision steps by evaluating a potential difference between two input signal lines and by adapting the potentials of the two input signal lines, depending on one result of evaluating the potential difference between the two input signal lines both one of the input signal lines is charged by adding a first predetermined charge and the other of the input signal lines is discharged by removing a second predetermined charge.

It may further be provided that the first and the second predetermined charges are equal.

BRIEF DESCRIPTION OF THE DRAWINGS

FIG. 1 shows a schematic of a four-bit differential SAR analog-digital converter, according to an embodiment of the invention.

DETAILED DESCRIPTION

Figure 2A:
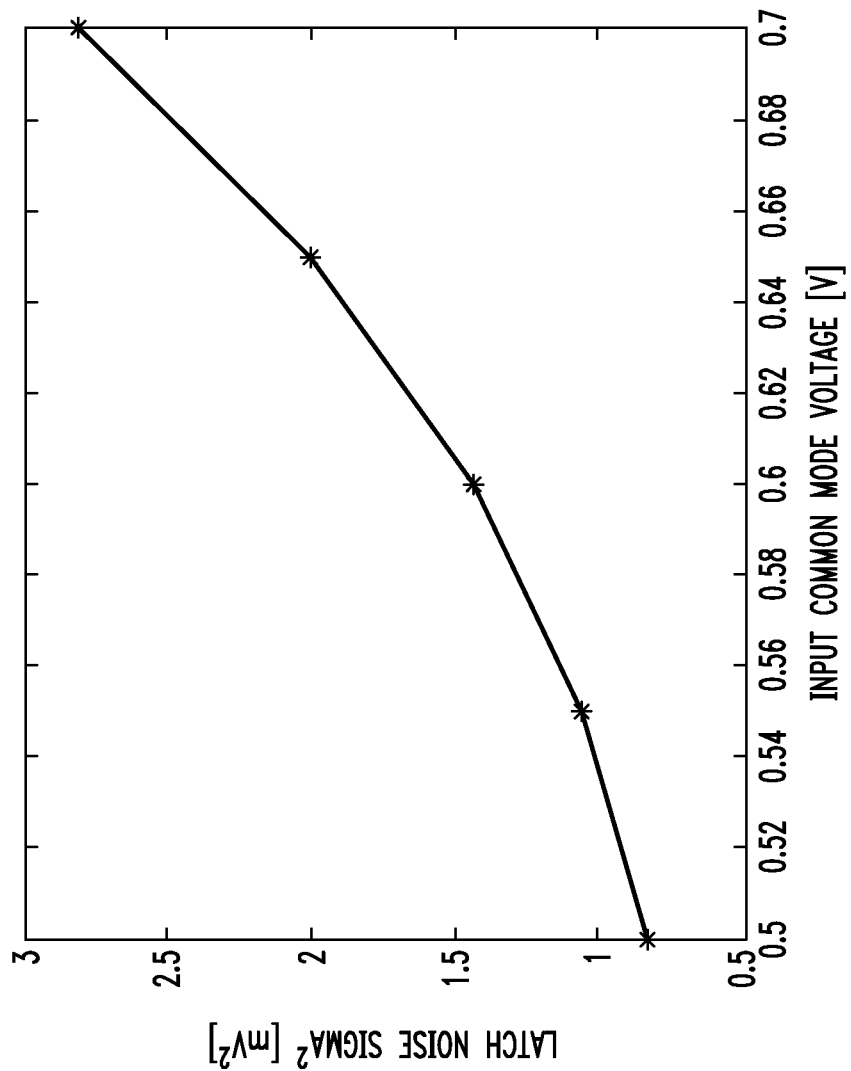
FIGS. 2A-2B show diagrams illustrating the latch noise and the latch speed versus the input common mode voltage.

FIG. 1 shows a differential analog-digital converter 1 according to an embodiment. The analog-digital converter 1 has a topology generally known from SAR converters. The analog-digital converter 1 has a decision latch 2. The decision latch 2 can be a conventional operational amplifier. The operational amplifier is configured to output an output signal the level of which indicates whether a differential input voltage applied between a non-inverting input and an inverting input is positive or negative. In the present case it is assumed that the decision latch 2 outputs a signal low level, i.e. a logical "0" for a negative input voltage, and a signal high level, i.e. a logical "1" for a positive input voltage. The decision latch 2 serves for performing decision steps and provides a decision output.

The non-inverting input of the decision latch 2 is connected with a first input signal line 3 and the inverting input is connected with a second input signal line 4. The first input signal line 3 is connected to a first input terminal 5 via a first input switch 6 and the second input signal line 4 is connected to a second input terminal 7 via a second input switch 8. The first and second input terminals 5, 7 are for receiving a differential input signal $U_{inp}$, to be digitally converted by the analog-digital converter 1. The input switches 6, 8 can be common CMOS switches or the like.

The first input signal line 3 is connected to a first capacitor bank 10 and a second capacitor bank 11 and the second input signal line 4 is connected to a third capacitor bank 12 and a fourth capacitor bank 13. In other words, each input signal line 3, 4 is connected to two capacitor banks.

The capacitor banks 10, 11, 12, 13 in the illustrated embodiment each have three switched capacitor units 15. Each switched capacitor unit 15 has one capacitor 16 the first end of which is coupled to the respective signal line 3, 4 and the second end of which is coupled to an output of an inverter 17. The inverter 17 is capable of applying a first (lower) reference potential $V_{ref-}$ or a second (upper) reference potential $V_{ref+}$ to the second end of the capacitor 16, depending on one of control signal d1 to d6 applied at a respective inverter input. Each inverter 17 has a serially connected semiconductor switches preferably CMOS transistors the gates of which the respective control signal d1 to d6 is applied while the series connection is coupled with the first reference potential $V_{ref-}$ and the second reference potential $V_{ref+}$. This allows to selectively apply one of the reference potentials $V_{ref+}$ and $V_{ref-}$ to the second end of the respective capacitor 16.

In the present embodiment, the number of capacitors of each capacitor bank 10, 11, 12, 13 is 3; however, the number of capacitors of the capacitor bank can differ and can be lower or higher than 3, depending on the required resolution of the analog-digital converter 1. Furthermore, it is preferred that the capacitor banks 10, 11, 12, 13 have the same number of capacitors; however, it is also possible to have at least one capacitor bank the number of whose capacitors 16 differs from the number of capacitors of the other capacitor banks.

In particular, the control signals d1 to d3 are for controlling the reference potential applied on the second ends of the capacitors 16 of the first capacitor bank 10 and the fourth capacitor bank 13. The control signals d4 to d6 are for controlling the reference potential applied on the second ends of the capacitors 16 of the second and the third capacitor bank 11, 12.

The three capacitors 16 of each of the capacitor banks 10, 11, 12, 13 have capacitances of 4C, 2C and C to provide a binary conversion while the capacitor 16 having the capacitance of 4C provides for the most significant bit and the capacitor 16 having the capacitance of C provides for the least significant bit.

The control signals d1 to d3 on the inverter inputs of the inverters 17 of the first capacitor bank 10 and the fourth capacitor bank 13 are inverted. In the present embodiment the control signals applied to the first capacitor bank 10 are inverted control signals /d1 to /d3 and the control signals applied to the first capacitor bank 10 are non-inverted control signals d1 to d3.

According to the inverter design, a low level (logical "0") of the non-inverted control signals d1 to d6 lead to the output of the second reference potential $V_{ref+}$ to the second end of the respective capacitor 16 and the high level of the control signals d1 to d6 results in applying the first reference potential $V_{ref-}$ to the second end of the respective capacitor 16. Analogously, the inverted control signals /d1 to /d6 lead to the output of the first reference potential $V_{ref-}$ to the second end of the respective capacitor 16 and the high level of the control signals d1 to d6 results in applying the second reference potential $V_{ref+}$ to the second end of the respective capacitor 16.

The control signals d1 to d6 are generated by means of a control unit 20. Further, the control unit 20 controls the first and second input switches 6, 8. The main task of the control unit is to control the conversion process in its timely sequence such that a comparison step and step of switching the switched capacitor units 15 are consecutively carried out.

Furthermore, a register 21 is coupled having register cells 22 to store comparison outputs generated by the decision latch 2. The number of register cells 22 corresponds to the number of capacitors 16 in each of the capacitor banks 10, 11, 12, 13, i.e. four, and which is also controlled by the control unit 20 to be operated as a shift register. In other words, the control unit 20 controls the register 21 so that the result of each comparison of a number of decision steps is successively stored into the register cells 22 of the register 21.

In general, the operation of the control unit 20 serves for providing control signals d1 to d6 that, depending on a previous result of a decision step performed by the decision latch 2, the loads of each input signal line 3, 4 is changed. This sequence is repeated for each capacitor 16 of each of the capacitor banks 10, 11, 12, 13, starting with the capacitor 16 having the highest capacitance to the capacitor 16 having the lowest capacitance in order of decreasing capacitances while storing the comparison outputs obtained in the decision latch 2 into a respective register cell 22 of the register 21 after each comparison step. As a general rule, the switching of the switched capacitor units 15 is carried out such that the absolute value of the voltage difference between the charged input signal lines 3, 4 is reduced.

One aspect of the topology of the differential SAR analog-digital converter of FIG. 1 is to provide the possibility to either increase or decrease the potential of each input signal line 3, 4 and that after at least one decision step the potentials of both input signal lines 3, 4 are changed at a time while the direction of the potential changes is different. Therefore, two capacitor banks on each input signal line 3, 4 are provided which are switched to keep the input common mode voltage variation low.

Figure 2B:
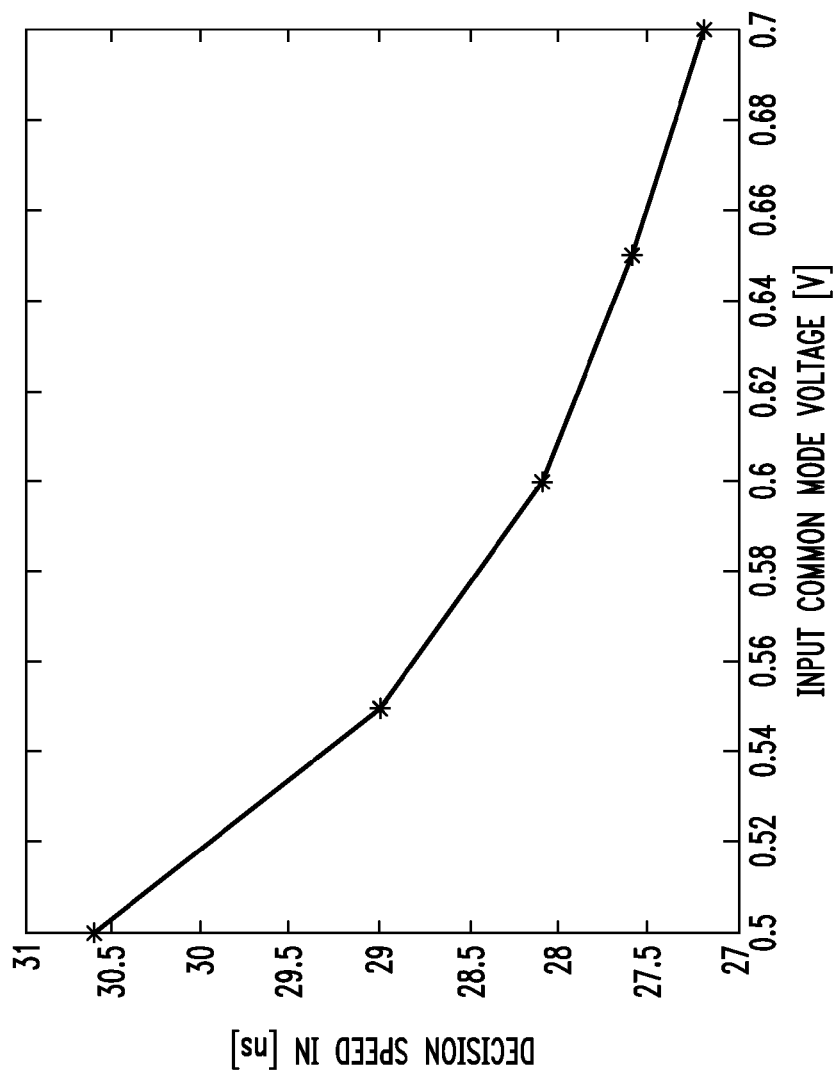

In FIGS. 2a and 2b, it is shown diagrams depicting the latch noise sigma$^2$ determining the decision accuracy and the latch speed versus the input common mode voltage of the decision latch 2. It can be seen that latch noise increases versus the input common mode voltage thereby decreasing the decision accuracy. Further, the decision speed is affected by an increasing input common mode voltage.

To achieve lower input common mode variations, the control unit 20 provides control signals d1 to d6, so that after each comparison step capacitors 16 are switched to reduce the absolute value of the potential difference between the input signal lines 3, 4. This is performed by changing the potential of the first input signal line 3 towards the potential of the second input signal line 4 and to change the potential of the second input signal line 4 towards the potential of the first input signal line 3. The amount of the changes is determined by the voltage difference between the first and the second reference potential and the capacitance of the capacitor 16 to be switched.

Figure 3:
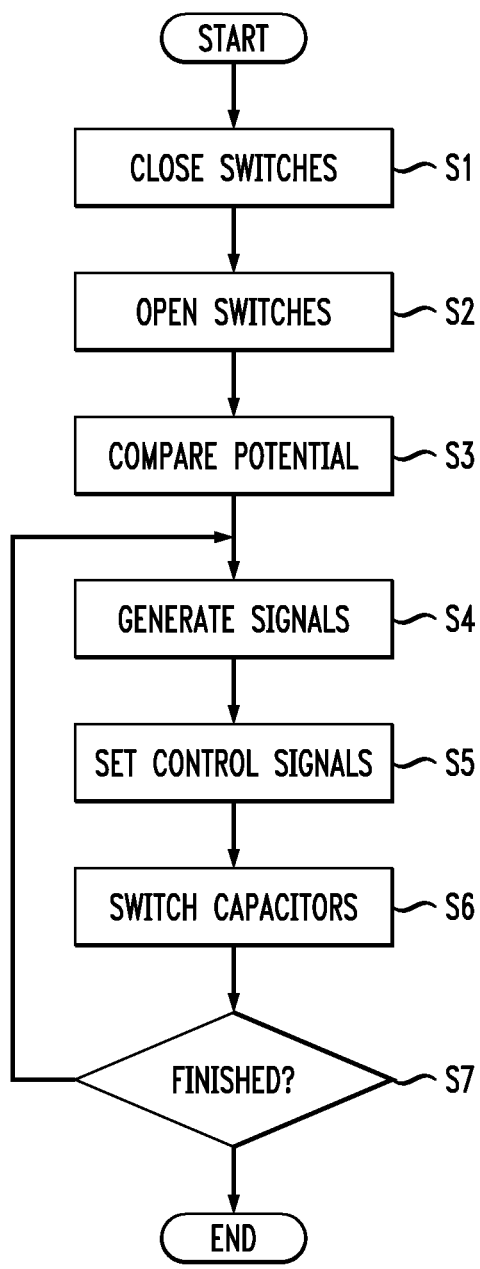
FIG. 3 shows a flow chart for illustrating the method for operating a differential SAR analog-digital converter, according to an embodiment of the invention.

In the following, in view of FIG. 3, a method for operating the analog-digital converter 1 is described. In step S1 the first and second input switches 6, 8 are closed to pre-charge the first and second input signal lines 3, 4 with the input voltage $U_{inp}$ applied at the first and second input terminal 5, 7. During pre-charging, all control signals d1 to d6 are reset to the low level (logical "0") such that the second ends of the capacitors 16 of the first capacitor bank 10 are connected to the first reference potential $V_{ref-}$, the second ends of the capacitors 16 of the second capacitor bank 11 are connected to the second reference potential $V_{ref+}$, the second ends of the capacitors 16 of the third capacitor bank 12 are connected to the first reference potential $V_{ref-}$ and the second ends of the capacitors 16 of the fourth capacitor bank 13 are connected to the second reference potential $V_{ref+}$.

After the first and the second input signal lines 3, 4 have been charged, the first and second input switches 6, 8 are opened in step S2, so that the first and second input signal lines 3, 4 keep their charge due to their attached capacities.

After the first and second input switches 6, 8 have been opened in step S2, each capacitor 16 is charged with respect to the specific reference potential applied to its second end. In step S3, a first comparison step is performed using the decision latch 2, the decision result output D1 of which is written into a first of the register cells 22 of the register 21.

In step S4, depending on the first decision result D1, a first and a fourth control signal d1, d4 is generated. Usually, each of the control signals d1 to d6 corresponds to one result obtained in the preceding conversion step. If in the present case a positive differential voltage between the first and second input lines 3, 4 exists, the first decision step would result in a high level result output (logical "1"). This result leads to a change of the level of the fourth control signal d4 while maintaining the other control signals at their set levels. If in the present case a negative differential voltage between the first and second input lines 3, 4 is detected, the first decision step would result in a low level result output (logical "0"). This result leads to a change of the level of the first control signal d1 while maintaining the other control signals at their set levels.

If the result of the first decision step is a logical "1", the change of the fourth control signal d4 from a logical "0" to a logical "1" would lead to a change of the second reference potential $V_{ref+}$ at the second end of the capacitor 16 having the highest capacitance C4 of the second capacitor bank 11 to the first reference potential $V_{ref-}$. Simultaneously, it would lead a change of the reference potential at the second end of the capacitor 16 having the highest capacitance C4 of the third capacitor bank 12 from a first reference potential $V_{ref-}$ to a high reference potential $V_{ref+}$. Consequently, if a positive differential voltage is applied between the first and second input signal lines 3, 4 during the first decision step, this positive voltage difference is reduced by decreasing the potential on the first input signal line 3 and by increasing the potential on the second input signal line 4.

Then, after the level of the first or fourth control signals are set a next decision step S5 is started and the decision result defines the second and fifth control signals d2 and d5 for the switched capacitor unit 15 related to the next highest capacitances in the same manner as described above. In step S6 the switched capacitor units 15 are switched depending on the second or fifth control signal d2 and d5.

This sequence is carried out until in step S7 it is determined that the last decision step has been carried out regarding switching a lowest available capacitance of the least significant switched capacitor unit 15. In this case the conversion result is stored in the register 21 and can be retrieved for further processing. If it is determined that the recent decision step did not refer to the switching of the lowest available capacitance of the least significant switched capacitor unit 15, it is proceeded with step S4.

Substantially any adaptation of the potentials of the first and second input signal lines 3, 4, which leads to a reduction of the voltage difference between the potentials on the first and second input signal lines 3, 4, where one of the signal lines is increased in its potential and the other of the first and second input signal lines 3, 4 is decreased in its potential, the input common mode voltage variation is kept low. Preferably, the capacitors 16 of the capacitor banks 10, 11, 12, 13 and the reference potentials $V_{ref+}$, $V_{ref-}$ are selected to maintain the mean value of the potentials on the first and second input signal lines 3, 4 constant after each comparison step. This can be achieved, for example, by keeping the design of the input lines 3, 4 and of the capacitor banks 10, 11, 12, 13 substantially symmetrical, meaning that the capacitances of the capacitors 16 of the first capacitor bank 10 correspond to the capacitances of the capacitors 16 of the fourth capacitor bank 13, respectively, while the capacitances of the capacitors 16 of the second capacitor bank 11 substantially correspond to the capacitances of the capacitors 16 of the third capacitor bank 12, respectively.

What is claimed is:

1. A differential analog-digital converter comprising:
   a decision unit for evaluating a potential difference between two input signal lines;
   a number of charging units for each input signal line each configured to add a respective predetermined charge onto the respective input signal line;
   a number of discharging units for each input signal line each configured to remove a respective predetermined charge from the respective input signal line; and
   a control unit for selectively switching each of the charging units and discharging units so that depending on one result of evaluating the potential difference between the two input signal lines one of the input signal lines is charged by adding the predetermined charge of the respective switched charging unit while the respective other of the input signal lines is discharged by removing the predetermined charge of the respective switched discharging unit.

2. The converter of claim 1, wherein the number of charging units and the number of discharging units comprise switched capacitor units each having a capacitor and a semiconductor switch.

3. The converter of claim 2, wherein in at least one of the charging units and discharging units the respective capacitor is coupled with a first end at the respective input signal line and with a second end to the output of a respective semiconductor switch.

4. The converter of claim 1, wherein the predetermined charge to add to the one input signal line equals the predetermined charge to remove from the other input signal line.

5. The converter of claim 1, wherein the control unit is configured to perform a number of decision steps by means of the decision unit wherein in one decision step the predetermined charge to add to the one input signal line and the predetermined charge to remove from the other input signal line are adapted so that an absolute value of the potential change on the two input signal lines is equal.

6. The converter of claim 1, wherein the control unit is configured to perform a number of decision steps by means of the decision unit wherein the predetermined charges to be added to the one input signal line and to be removed from the other input signal line within one decision step are decreasing from one decision step to the next.

7. The converter of claim 6, wherein the control unit is configured to perform a number of decision steps by means of the decision unit wherein the predetermined charges to be added to the one input signal line and to be removed from the other input signal line within one decision step are decreasing from one decision step to the next by a factor of 2.

8. The converter of claim 2, wherein capacitances of the capacitors of the switched capacitance units coupled to a first one of the input signal lines substantially correspond to capacitances of the capacitors of the switched capacitance units coupled to a second one of the input signal lines.

9. The converter of claim 8, wherein respective ones of a first set of control signals are applied to semiconductor switches of each of the charging units and discharging units coupled to the first one of the input signal lines, respective ones of a second set of control signals are applied to semiconductor switches of each of the charging units and discharging units coupled to the second one of the input signal lines, and corresponding ones of the first set of control signals and the second set of control signals are logical complements of one another.

10. The converter of claim 3, wherein the semiconductor switches of the switched capacitor units are configured to apply a first reference potential or a second reference potential to the second end of the capacitors.

11. The converter of claim 10, wherein the first reference potential is a lower voltage potential than the second reference potential.

12. The converter of claim 2, wherein respective capacitors of each of the charging units and discharging units are coupled with a first end at one of the input signal lines and with a second end to an output of respective semiconductor switches.

* * * * *